United States Patent
Gabrielson, Jr. et al.

(10) Patent No.: US 8,238,544 B2
(45) Date of Patent: *Aug. 7, 2012

(54) TERMINATION FOR A LINE CARD IN A TELECOMMUNICATION SYSTEM

(75) Inventors: Carl E. Gabrielson, Jr., Santa Ana, CA (US); James E. Holbrook, Minneapolis, MN (US); Dale M. Terrien, Yorba Linda, CA (US); Gary Gottlieb, Irvine, CA (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 1267 days.

This patent is subject to a terminal disclaimer.

(21) Appl. No.: 11/958,139

(22) Filed: Dec. 17, 2007

(65) Prior Publication Data

US 2008/0101587 A1 May 1, 2008

Related U.S. Application Data

(63) Continuation of application No. 10/351,016, filed on Jan. 24, 2003, now Pat. No. 7,330,543.

(51) Int. Cl.
*H04M 5/00* (2006.01)
*H04M 1/00* (2006.01)

(52) U.S. Cl. .................................. 379/326; 379/413.04
(58) Field of Classification Search .................. 379/326, 379/413.04, 328; 439/620, 668, 688
See application file for complete search history.

(56) References Cited

U.S. PATENT DOCUMENTS

| | | | |
|---|---|---|---|
| 4,952,758 A | 8/1990 | Dara et al. |
| 5,162,675 A | 11/1992 | Olsen et al. |
| 5,199,878 A | 4/1993 | Dewey et al. |
| 5,432,486 A | 7/1995 | Wong |
| 5,515,515 A | 5/1996 | Kennedy et al. |
| 5,530,623 A | 6/1996 | Sanwo et al. |
| 5,582,525 A | 12/1996 | Louwagie et al. |
| 6,597,689 B1 | 7/2003 | Chiu et al. |

*Primary Examiner* — William Deane, Jr.
(74) *Attorney, Agent, or Firm* — Fogg & Powers LLC

(57) ABSTRACT

A system of terminating signals in a telecommunication system is disclosed. In one embodiment a line card comprises functional circuitry, line card connector contacts and a termination resistor. The functional circuitry is used to interface first type ports with second type ports. The line card connector contacts are adapted to be selectively coupled to a backplane of a chassis. The termination resistor is adapted to terminate signal lines when a jumper is coupled across select line card contacts.

9 Claims, 3 Drawing Sheets

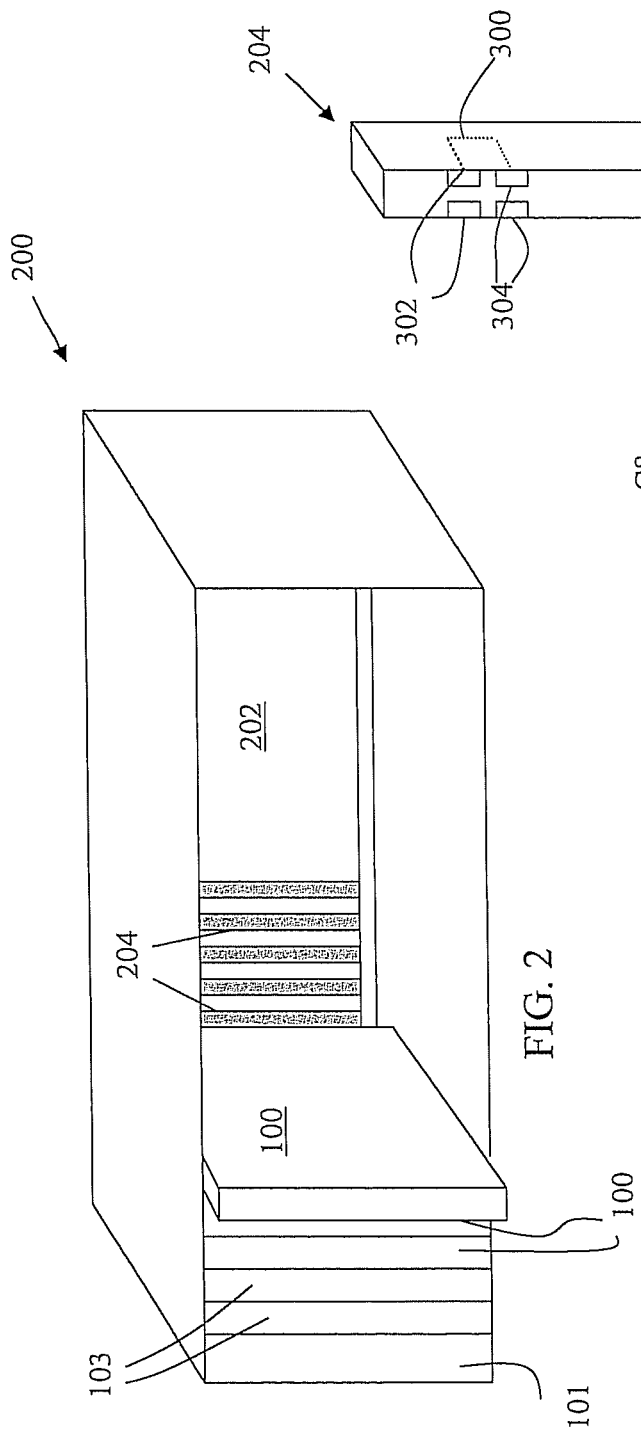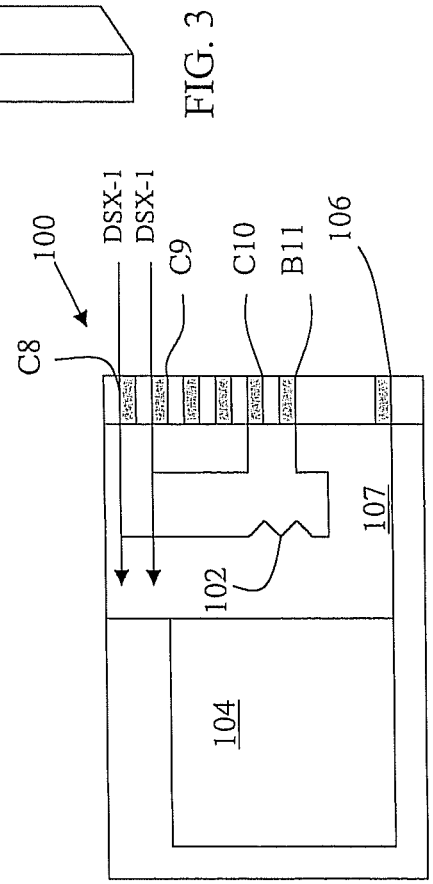

TERMINATION FOR A LINE CARD IN A TELECOMMUNICATION SYSTEM

CROSS REFERENCE TO RELATED APPLICATIONS

This application is a continuation of co-pending U.S. patent application Ser. No. 10/351,016 filed on Jan. 24, 2003 and entitled "TERMINATION FOR A LLINE CARD IN A TELECOMMUNICATION SYSTEM" (the '016 Application). The '016 Application is incorporated herein by reference.

TECHNICAL FIELD

The present invention relates generally to telecommunication systems and in particular the present invention relates to a termination resistor system for a line card in a telecommunication system.

BACKGROUND

Digital subscriber line (DSL) and T1/E1 chassis are used in telecommunication systems. One function of a DSL chassis is to interface ports and a function of a T1/E1 chassis is to interface T1/E1 ports. The same chassis can support either DSL or T1/E1 ports depending upon line cards used. The chassis includes a backplane. The backplane is adapted to deliver power to and provide high speed interconnections between, line cards, multiplexer cards and a management card. The line cards, multiplexer cards and management card are all adapted to plug into the backplane of the chassis. Line cards (or modules) are printed circuit boards that provide operational functions for designated phone lines or telephones in a telephone system.

The receive input of a DSX-1 line needs to be coupled across a termination resistor of a select value. One typical method of achieving this is by placing the termination resistor on the backplane. However, this limits the ability of using the same slot in the backplane for other purposes that don't require the use of a termination resistor. For example, in a situation where DSL ports are designed to not require termination for any loop. This would create a contradiction of having a termination for the DSX-1 ports but not for the DSL ports in the same chassis. Accordingly, it is desired in the art to have a chassis and line card combination that does not require a termination resistor on the backplane. Moreover, it is desired in the art to have a line card that is designed to work in both a chassis that has a backplane with a termination resistor and a chassis having a backplane without a termination resistor.

For the reasons stated above and for other reasons stated below which will become apparent to those skilled in the art upon reading and understanding the present specification, there is a need in the art for an improved line card and chassis system.

SUMMARY

The above-mentioned problems of line card termination in a telecommunication system and other problems are resolved by the present invention and will be understood by reading and studying the following specification.

In one embodiment, a line card for a telecommunication system is disclosed. The line card comprises functional circuitry, line card connector contacts and a termination resistor. The functional circuitry is used to interface first type ports with second type ports. The line card connector contacts are adapted to be selectively coupled to a backplane of a chassis. The termination resistor is adapted to terminate signal lines when a jumper is coupled across select line card contacts.

In another embodiment, a telecommunication system is disclosed. The telecommunication system comprises a chassis and one or more line cards. The chassis has a backplane. The backplane has a plurality of backplane connectors electrically coupled to the backplane. Each of the one or more line cards have a plurality of electrical card connection contacts that are adapted to be selectively coupled to an associated backplane connector. At least one of the one or more line cards further comprises functional circuitry to interface DSX-1 or DSL ports with other ports and a line card termination resistor. The line card termination resistor is adapted to terminate DSX-1 lines when a jumper is coupled across select electrical line card connector contacts.

In another embodiment, a line card for a telecommunication system is disclosed. In this embodiment the line card comprises functional circuitry, line card connector contacts and an impedance network. The functional circuitry is used to interface first type ports with second type ports. The line card connector contacts are adapted to be selectively coupled to a backplane of a chassis. The impedance network is adapted to terminate signal lines when a jumper is coupled across select line card contacts.

In further another embodiment, a method of terminating signal lines is disclosed. The method comprises coupling signal lines to a chassis. When a backplane of the chassis includes a backplane termination resistor, terminating signals with the backplane termination resistor. Moreover, when the backplane of the chassis does not include a backplane termination resistor; terminating the signals with a line card termination resistor contained on a line card.

In still yet another embodiment, a method of interfacing DSX-1 or DSL signals, the method comprising coupling the DSX-1 lines to a backplane of a chassis. Coupling the DSL lines to the backplane of the chassis. When a backplane includes a backplane termination resistor, terminating DSX-1 signals with the back plane termination resistor. When the backplane of the chassis does not include a backplane termination resistor; terminating the DSX-1 signals with a line card termination resistor contained in a line card. Interfacing the DSL and DSX-1 signals with the line card.

BRIEF DESCRIPTION OF THE DRAWINGS

The present invention can be more easily understood and further advantages and uses thereof more readily apparent, when considered in view of the description of the preferred embodiments and the following figures in which:

FIG. 1 is a schematic diagram of a line card of one embodiment of the present invention;

FIG. 2 is a front perspective view of a chassis and line cards of one embodiment of the present invention;

FIG. 3 is a front perspective view of a backplane connector of a chassis of one embodiment of the present invention;

In accordance with common practice, the various described features are not drawn to scale but are drawn to emphasize specific features relevant to the present invention. Reference characters denote like elements throughout Figures and text.

DETAILED DESCRIPTION

Figure 4:
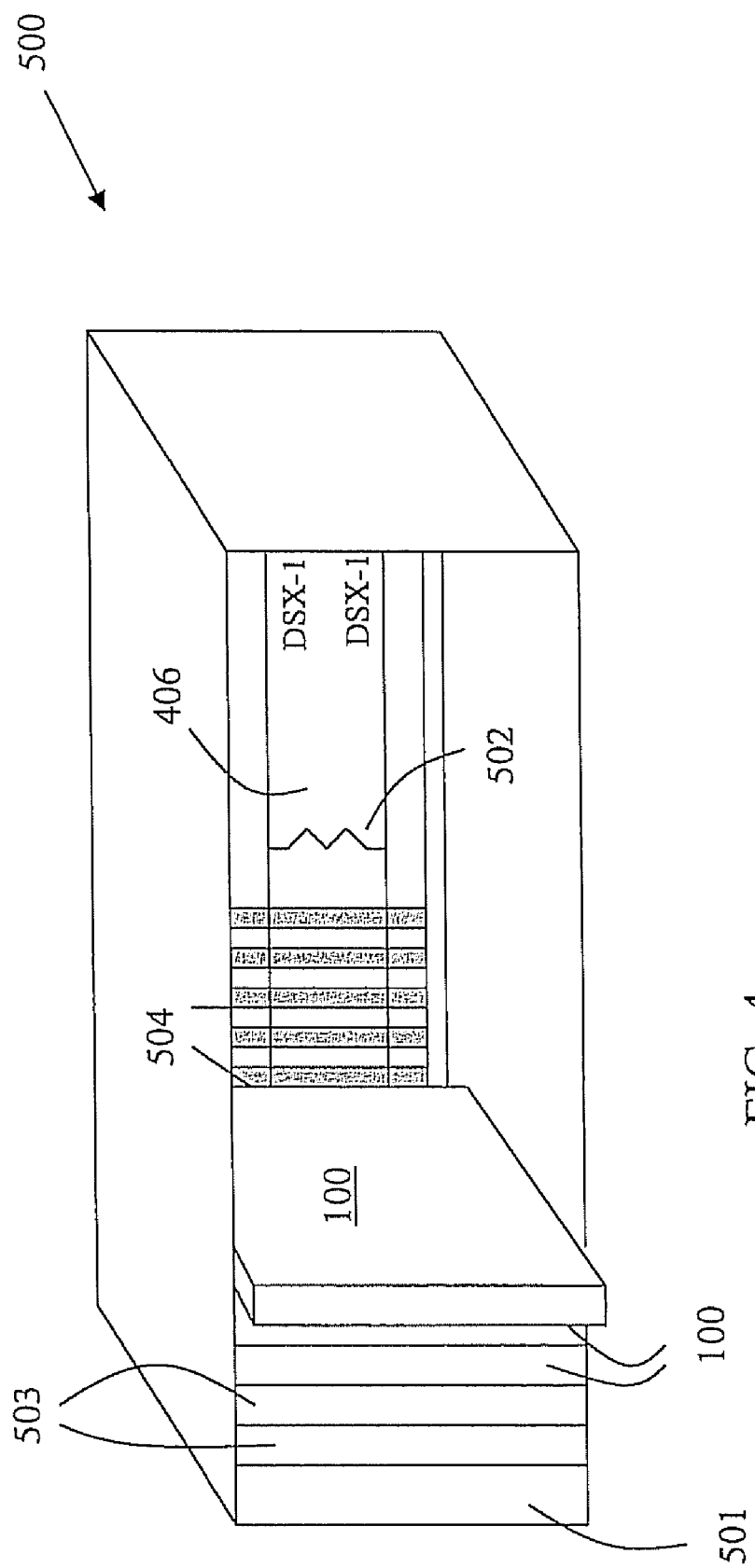
FIG. 4 is a front perspective view of another embodiment of the line cards and chassis of the present invention.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention include a line card that is adapted to work in any chassis that has a termination resistor built into the backplane of the chassis as well as a chassis without termination resistor built into the backplane. Referring to FIG. 1, one embodiment of a line card (module) 100 of the present invention is illustrated. As illustrated, line card 100 includes functional circuitry 104 and a termination resistor 102. The functional circuitry 104 performs the functions of the line card 100 such as interfacing the DSX-1 or DSL ports with other ports (first type ports with second type ports). The line card termination resistor 102 for a DSX-1 line card is included in circuit 107. As illustrated in the embodiment, DSX-1 lines are connected through card connection contacts C8 and C9 to circuit 107. The card connection contacts are generally designated by 106. It will be understood in the art that the line card will generally have many more card connection contacts 106 than what is shown in FIG. 1 and that only a limited number of card connection contacts 106 are shown to better illustrate the features of the present invention.

A front perspective view of one embodiment of a telecommunication system chassis 200 is illustrated in FIG. 2. Also illustrated are line cards 100, multiplexer cards 103 and management card 101. Further shown is backplane 202 and backplane connectors 204. The line cards 100, multiplexer cards 103 and the management card 101 are all adapted to be inserted in associated backplane connectors 204 to create electrical connections to the backplane 202. A typical method of creating an electrical connection between the cards and the backplane 202 is by using a DIN connector or similar method.

In one embodiment, backplane 202 of chassis 200 does not include a termination resistor to terminate DSX-1 lines. As described above, the line cards 100 of FIG. 1 include line card termination resistor 102 adapted to terminate the DSX-1 lines. Referring to FIG. 3, an example of one embodiment of a backplane connector 204 is illustrated. In this embodiment, the backplane connector 204 contains a jumper 300 that is coupled across electrical backplane connector contacts 302 and 304. Backplane contacts 302 and 304 are adapted to be in electrical connection with contacts B11 and C10 of line card 100 respectively when line card 100 is inserted into the respective backplane connector 204. As illustrated, jumper 300 completes circuit 107 that contains the termination resistor 102 to terminate the DSX-1 line. Although jumper 300 is illustrated as being in the backplane connector 204 in this embodiment, it will be understood in the art that the jumper could be located in other locations as well, such as the backplane, and that the present invention is not limited to having jumper 300 in backplane connector 204.

FIG. 4 illustrates the use of line card 100 in a chassis 500 that has a backplane termination resistor 502 coupled to the backplane 506. As illustrated in the embodiment of FIG. 4, line cards 100, multiplexer cards 503 and management card 501 are adapted to be inserted into respective backplane connectors 504. In this embodiment, when a line card 100 is inserted in the backplane connector 504 no jumper is present to provide an electrical connection across pins B11 and C10 of line card 100. As a result, circuit 107 that includes line card termination resistor 102 in line card 100 remains open. Therefore, a backplane resistor such as backplane termination resistor 502 is used instead of the line card termination resistor 102 to terminate DXS-1 lines in the embodiment of FIG. 4. Accordingly, line card 100 is adapted to be used in a chassis that provides a termination resistor in the backplane and a chassis without a termination resistor in the backplane.

Figure 5:
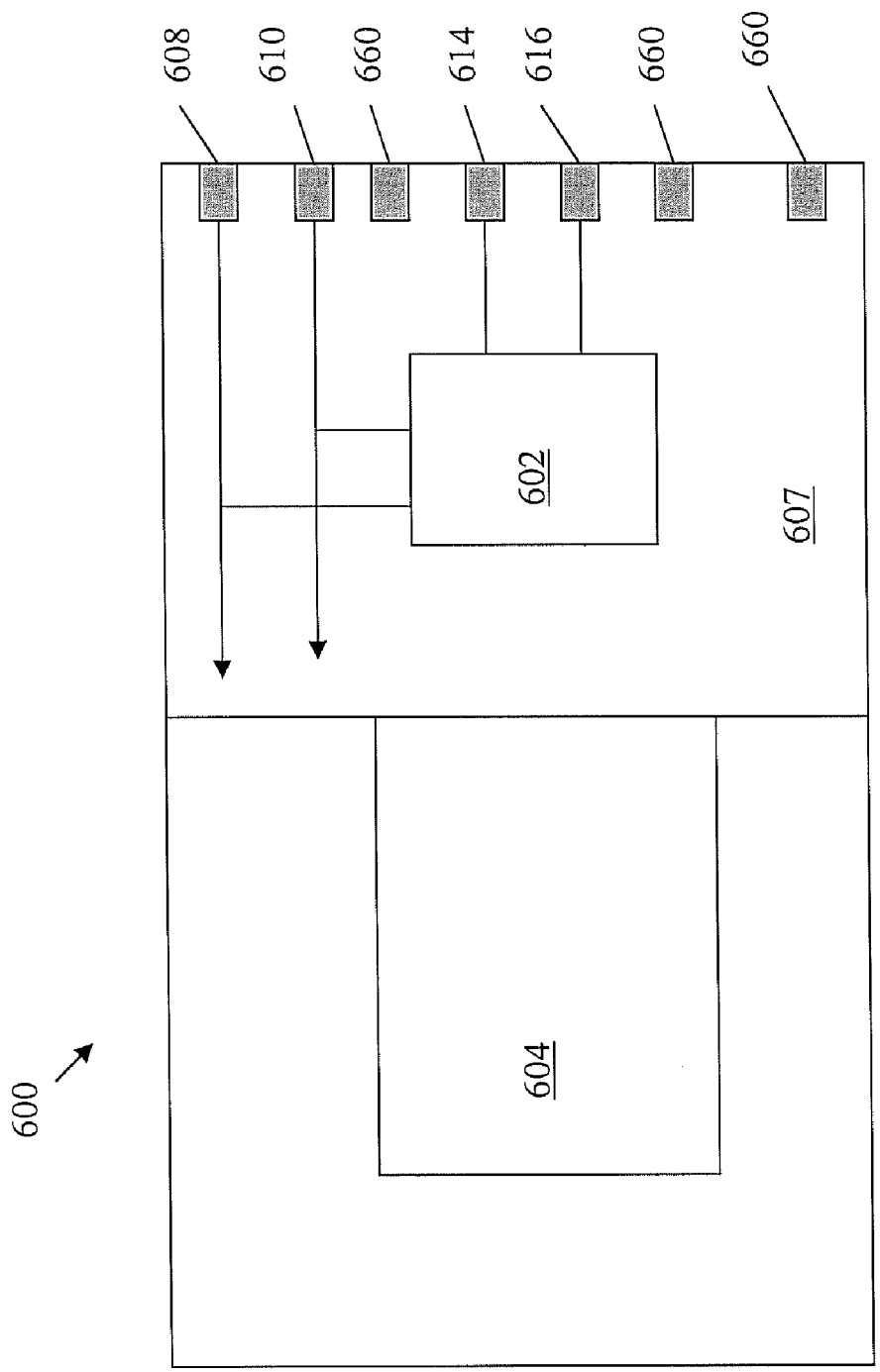
FIG. 5 is a schematic diagram of another embodiment of the present invention.

Referring to FIG. 5, another embodiment of a line card 600 of the present invention is illustrated. Line card 600 is adapted to apply to a chassis that uses an impedance to terminate line signals. As illustrate, FIG. 5 includes functional circuit 604, circuit 607 and line connector contacts 660. Circuit 607 includes impedance network 602 coupled in a similar fashion as the termination resistor of FIG. 1. The impedance network 602 is adapted to terminate the line signals. The line connector contacts 660 include card collector contacts 616 and 614. Card collector contacts 616 and 614 are adapted to be electrically coupled to a jumper similar to jumper 300 of FIG. 3. As in the above described embodiments, the jumper is used when a backplane does not contain an impedance needed to terminate the line signals. Card collector contacts 660 also include card collector contacts 608 and 610 which are adapted to couple signal lines to the line card, similar to card collector contacts C8 and C9. In fact, in one embodiment, card collector contacts 608 and 610 are pins C8 and C9 and card collector contacts 616 and 614 are pins B11 and C10. Further, in one embodiment the line signals are DSX-1 signals coupled to DSX-1 lines. In yet another embodiment the impedance network includes a resistor similar to termination resistor 102 of FIG. 1. In addition, it will be understood in the art that the embodiments of the present invention can be applied to any type of line card and that the present application is not limited to DSX-1 and DSL flavors.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A telecommunication chassis comprising:
    a backplane; and
    a plurality of backplane connectors, each backplane connector coupled to the backplane, each backplane connector is further configured to couple a line card to the backplane, each backplane connector having backplane contacts to provide electrical connections to a coupled line card; and
    at least one jumper, each jumper coupled to provide an electrical connection between a pair of backplane contacts of an associated backplane connector, wherein when a line card having a termination resistor is coupled to the at least one backplane connector that has the pair of backplane connectors that are in electrical connection, the termination resistor of the line card is coupled for use by the jumper.

2. The telecommunication chassis of claim 1, wherein the at least one jumper is located in its associated backplane connector.

3. The telecommunication chassis of claim 1, wherein the at least one jumper is located in the backplane.

4. A line card for a telecommunication system, the line card comprising:

functional circuitry of the line card;

line card connector contacts configured to be selectively coupled to backplane contacts in an associated backplane connector of a telecommunication chassis, the line card connectors including a first line card connector and a second line card connector;

a first signal path;

a second signal path, the second signal path coupled to the first line card connector; and a termination resistor having a first side coupled to the second line card connector and a second side coupled to the first signal path, wherein an electrical connection between the first line card connector and the second line card connector terminates the first and second signal paths across the termination resistor.

5. The line card of claim 4, wherein the functional circuitry includes circuitry to interface first type ports with second type ports.

6. The line card of claim 4, wherein the first and second signal paths are DSX-1 signal paths.

7. A line card for a telecommunication system, the line card comprising:

functional circuitry of the line card;

line card connector contacts configured to be selectively coupled to backplane contacts in an associated backplane connector of a telecommunication chassis, the line card connectors including a first line card connector and a second line card connector;

a first signal path;

a second signal path, the second signal path coupled to the first line card connector; and an impedance network having a first side coupled to the second line card connector and a second side coupled to the first signal path, wherein an electrical connection between the first line card connector and the second line card connector terminates the first and second signal paths across the impedance network.

8. The line card of claim 7, wherein the functional circuitry includes circuitry to interface first type ports with second type ports.

9. The line card of claim 7, wherein the first and second signal paths are DSX-1 signal paths.

* * * * *